(12) United States Patent
Jung

(10) Patent No.: US 9,356,581 B2
(45) Date of Patent: May 31, 2016

(54) DATA OUTPUT CIRCUIT OF A SEMICONDUCTOR APPARATUS

(71) Applicant: SK hynix Inc., Icheon-si Gyeonggi-do (KR)

(72) Inventor: Hae Kang Jung, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/325,563

(22) Filed: Jul. 8, 2014

(65) Prior Publication Data

US 2015/0280692 A1    Oct. 1, 2015

(30) Foreign Application Priority Data

Mar. 27, 2014    (KR) .................. 10-2014-0036205

(51) Int. Cl.
*H03K 3/015* (2006.01)
*H03K 3/011* (2006.01)
*H03K 19/00* (2006.01)
*H03K 19/0185* (2006.01)

(52) U.S. Cl.
CPC ............... *H03K 3/015* (2013.01); *H03K 3/011* (2013.01); *H03K 19/0005* (2013.01); *H03K 19/018585* (2013.01)

(58) Field of Classification Search
CPC combination set(s) only.
See application file for complete search history.

(56) References Cited

U.S. PATENT DOCUMENTS

| 5,517,142 | A  | * | 5/1996 | Jang et al. | .................. | 327/108 |
| 7,719,307 | B2 | * | 5/2010 | Lee | .................. | 326/30 |
| 7,906,986 | B2 | * | 3/2011 | Lee | .................. | 326/30 |
| 8,120,381 | B2 | * | 2/2012 | Ko | .................. | 326/30 |

FOREIGN PATENT DOCUMENTS

KR    1020090070433 A    7/2009

* cited by examiner

*Primary Examiner* — An Luu
(74) *Attorney, Agent, or Firm* — William Park & Associates Ltd.

(57) ABSTRACT

A data output circuit of a semiconductor apparatus is provided. The data output circuit may include a pull-up driver including a plurality of leg units configured to provide respective resistance values which are selected based on code signals, provide a total resistance value which is selected in response to one or more of the plurality of leg units being selectively activated based on selection signals, and configured to apply an output voltage with an output voltage level selected according to the selection of the total resistance value among a plurality of output voltage levels, to a data output pad. The data output circuit may include a control block configured to generate the selection signals in response to mode register signals. The data output circuit may include a code generator configured to generate the code signals based on a comparison of a reference voltage to a replica output voltage which varies according to an external resistance.

20 Claims, 7 Drawing Sheets

FIG.5

| Setting resistance using one leg unit | | | | | |
|---|---|---|---|---|---|
| | R5 | R4 | R3 | R2 | R1 | R0 |
| SS | 944 | 1888 | 3775 | 7550 | 15100 | 30200 |
| TT | 480 | 960 | 1920 | 3840 | 7680 | 15360 |
| FF | 225 | 450 | 900 | 1800 | 3600 | 7200 |

| PUCODE<5:0> | | | | | |
|---|---|---|---|---|---|
| PUCODE<5> | PUCODE<4> | PUCODE<3> | PUCODE<2> | PUCODE<1> | PUCODE<0> |
| 1 | 1 | 1 | 1 | 1 | 1 |
| 1 | 0 | 0 | 0 | 0 | 0 |
| 0 | 0 | 1 | 1 | 1 | 1 |

| Selected Resistor | | | | | | Parallel Resistance Value |
|---|---|---|---|---|---|---|
| R5 | R4 | R3 | R2 | R1 | R0 | |
| 944 | 1888 | 3775 | 7550 | 15100 | 30200 | 479 |
| 480 | X | X | X | X | X | 480 |
| X | X | 900 | 1800 | 3600 | 7200 | 480 |

| Setting resistance using two leg units | | | | | |
|---|---|---|---|---|---|
| | R5 | R4 | R3 | R2 | R1 | R0 |
| SS | 472 | 944 | 1888 | 3775 | 7550 | 15100 |
| TT | 240 | 480 | 960 | 1920 | 3840 | 7680 |
| FF | 113 | 225 | 450 | 900 | 1800 | 3600 |

| PUCODE<5:0> | | | | | |
|---|---|---|---|---|---|
| PUCODE<5> | PUCODE<4> | PUCODE<3> | PUCODE<2> | PUCODE<1> | PUCODE<0> |
| 1 | 0 | 1 | 0 | 1 | 0 |
| 0 | 1 | 0 | 1 | 0 | 1 |
| 0 | 0 | 1 | 0 | 1 | 0 |

| Selected Resistor | | | | | | Parallel Resistance Value |
|---|---|---|---|---|---|---|
| R5 | R4 | R3 | R2 | R1 | R0 | |
| 472 | X | 1888 | X | 7550 | X | 360 |
| X | 480 | X | 1920 | X | 7680 | 366 |
| X | X | 450 | X | 1800 | X | 360 |

| Standard | | | | Design | | Resistance Value(Ω) |
|---|---|---|---|---|---|---|
| MR3_OP<0> | MR22_OP<2> | MR22_OP<1> | MR22_OP<0> | SEL_UP<2:0> | SELTUP<5:0> | |
| 1(VDDQ/3) | 0 | 0 | 0 | Disable | Disable | |
| | 0 | 0 | 1 | 001 | 000001 | 480 |
| | 0 | 1 | 0 | 010 | 000011 | 240 |
| | 0 | 1 | 1 | 011 | 000111 | 160 |
| | 1 | 0 | 0 | 100 | 001111 | 120 |
| | 1 | 0 | 1 | 101 | 011111 | 96 |
| | 1 | 1 | 0 | 110 | 111111 | 60 |
| | 1 | 1 | 1 | RFU | RFU | |
| 0(VDDQ/2.5) | 0 | 0 | 0 | Disable | Disable | |
| | 0 | 0 | 1 | 010 | 000011 | 360 |
| | 0 | 1 | 0 | 100 | 001111 | 180 |
| | 0 | 1 | 1 | 110 | 111111 | 120 |
| | 1 | 0 | 0 | DNU | DNU | |
| | 1 | 0 | 1 | DNU | DNU | |
| | 1 | 1 | 0 | DNU | DNU | |
| | 1 | 1 | 1 | RFU | RFU | |

| Standard | | | Design | Resistance Value(Ω) |
|---|---|---|---|---|
| MR3_OP<5> | MR3_OP<4> | MR3_OP<3> | SELTDN<5:0> | |
| 0 | 0 | 0 | Disable | |
| 0 | 0 | 1 | 000001 | 240 |
| 0 | 1 | 0 | 000010 | 120 |
| 0 | 1 | 1 | 000011 | 80 |
| 1 | 0 | 0 | 000111 | 60 |
| 1 | 0 | 1 | 001111 | 48 |
| 1 | 1 | 0 | 011111 | 40 |
| 1 | 1 | 1 | RFU | |

DATA OUTPUT CIRCUIT OF A SEMICONDUCTOR APPARATUS

CROSS-REFERENCES TO RELATED APPLICATION

The present application claims priority under 35 U.S.C. §119(a) to Korean application number 10-2014-0036205, filed on Mar. 27, 2014, in the Korean Intellectual Property Office, which is incorporated herein by reference in its entirety.

BACKGROUND

1. Technical Field

Various embodiments relate to a semiconductor apparatus, and more particularly, to a data output circuit of a semiconductor apparatus.

2. Related Art

In a semiconductor apparatus, it is important to constantly retain the level of an output voltage (VOH), so as to ensure stable data communication between the semiconductor apparatus and an external system electrically coupled with the semiconductor apparatus, for example, a memory controller. The output voltage (VOH) may be the voltage level of a data output pad (DQ) when outputting high level data.

SUMMARY

In an embodiment of the invention, a data output circuit of a semiconductor apparatus may include a pull-up driver including a plurality of leg units configured to be controlled in respective resistance values in response to code signals. The plurality of leg units may also be controlled in an entire resistance value as one or more of the plurality of leg units are selectively activated in response to selection signals. Further, the pull-up driver may be configured to apply an output voltage with an output voltage level selected according to a control of the entire resistance value among a plurality of output voltage levels, to a data output pad. The data output circuit may also include a control block configured to generate the selection signals in response to mode register signals. Further, the data output circuit may also include a code generator configured to generate the code signals according to an external resistor.

In an embodiment, a data output circuit of a semiconductor apparatus may include a first plurality of leg units commonly electrically coupled to a data output pad and configured to pull up the data output pad. The first plurality of leg units may also be configured to apply a first output voltage to the data output pad and control a level of the first output voltage in response to first selection signals and first code signals. The data output circuit of the semiconductor apparatus may also include a second plurality of leg units commonly electrically coupled to the data output pad and configured to pull down the data output pad. The second plurality of leg units may also apply a second output voltage to the data output pad, and control a level of a second output voltage in response second selection signals and second code signals.

In an embodiment, a data output circuit of semiconductor apparatus may include a pull-up driver commonly electrically coupled to a data output pad. The pull-up driver may be configured to apply a first output voltage to the data output pad in response to a data and control the level of the first output voltage when the data is at a high level. The data output circuit of the semiconductor apparatus may also include a pull-down driver commonly electrically coupled to the data output pad. The pull-down driver may be configured to apply a second output voltage to the data output pad in response to the data and control the level of the second output voltage when a data bar is at the high level.

BRIEF DESCRIPTION OF THE DRAWINGS

FIG. 5 is a table showing changes of the values of code signals by operation circumstances;

DETAILED DESCRIPTION

Hereinafter, a data output circuit of a semiconductor apparatus according to the invention will be described below with reference to the accompanying figures through various embodiments. In a semiconductor apparatus, it may be necessary for a semiconductor apparatus to support at least two levels of an output voltage (VOH) as required by an operation standard. Accordingly, a data output circuit of a semiconductor apparatus capable of supporting a multi-output voltage level is described herein.

Figure 1:
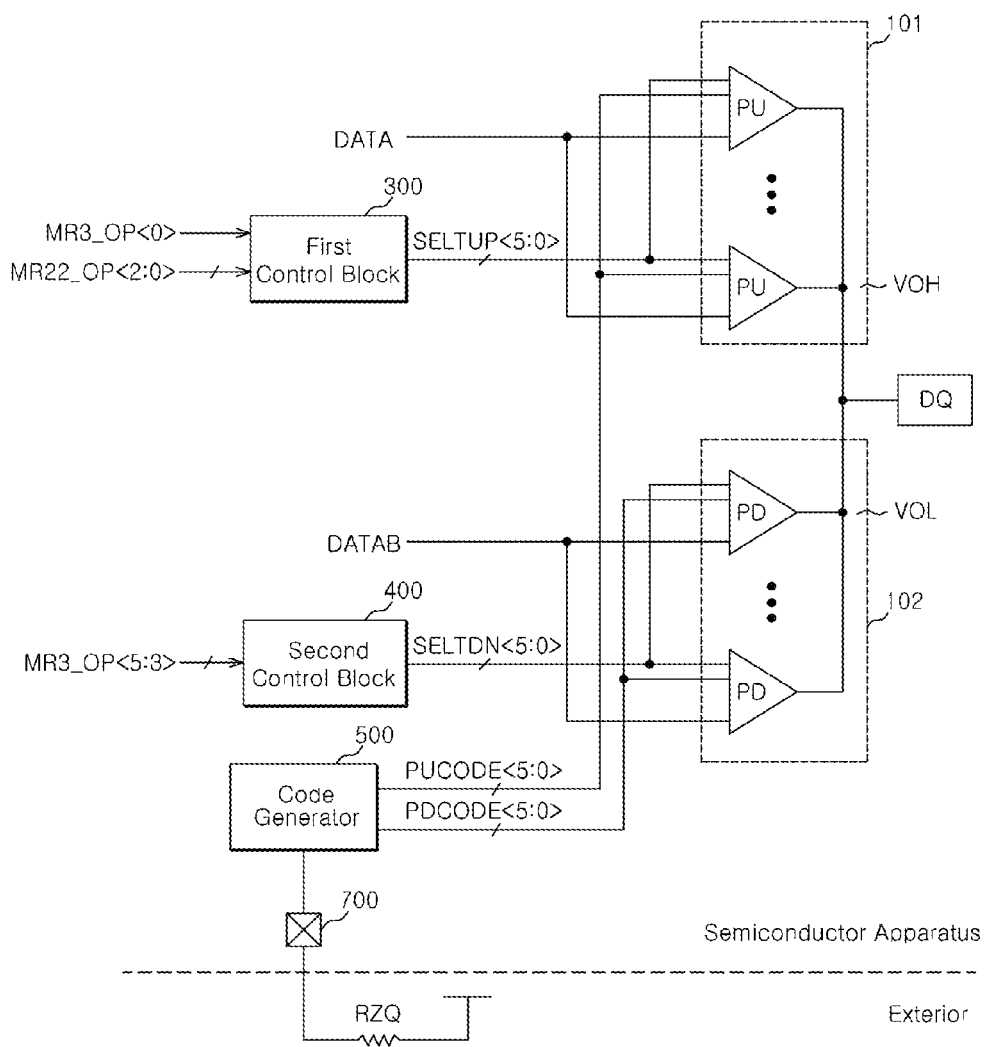
FIG. 1 is a block diagram of a data output circuit of a semiconductor apparatus in accordance with an embodiment of the invention.

Referring to FIG. 1, a data output circuit 100 of a semiconductor apparatus may include a pull-up driver 101, a pull-down driver 102, a first control block 300, a second control block 400, and a code generator 500.

The pull-up driver 101 may include a plurality of leg units PU.

The output terminals of the plurality of leg units PU are commonly electrically coupled with a data output pad DQ.

The plurality of leg units PU are leg units to pull up the data output pad DQ.

The plurality of leg units PU may be configured to apply an output voltage VOH to the data output pad DQ in response to data DATA.

The output voltage VOH may be the voltage level of the data output pad DQ when the data DATA is a first logic level, such as a high level.

The plurality of leg units PU may be configured to control the level of the output voltage VOH by being changed in their resistance values according to selection signals SELTUP<5:0> and first code signals PUCODE<5:0> when the data DATA is the high level.

The plurality of leg units PU may be configured in the same way.

The pull-down driver 102 may be configured to include a plurality of leg units PD.

The output terminals of the plurality of leg units PD are commonly electrically coupled with the data output pad DQ.

The plurality of leg units PD are leg units to pull down the data output pad DQ.

The plurality of leg units PD may be configured to apply an output voltage VOL to the data output pad DQ in response to the data DATA.

The output voltage VOL may be the voltage level of the data output pad DQ when data bar DATAB is a high level and when the data DATA is a second logic level such as a low level. The data bar DATAB may be a signal with a phase opposite to the data DATA.

The plurality of leg units PD may be configured to control the level of the output voltage VOL by being changed in their resistance values in response to selection signals SELTDN<5:0> and second code signals PDCODE<5:0> when the data bar DATAB is at the high level.

The plurality of leg units PD may be configured in the same way or in a substantially similar way.

The first control block 300 may be configured to generate the selection signals SELTUP<5:0> in response to mode register signals. The mode register signals may be a first mode register signal MR3_OP<0> and second mode register signals MR22_OP<2:0>.

The second control block 400 may be configured to generate the selection signals SELTDN<5:0> according to third mode register signals MR3_OP<5:3>.

The code generator 500 may be configured to generate the first code signals PUCODE<5:0> and the second code signals PDCODE<5:0> to control the resistance values of the pluralities of the respective leg units of the drivers based on the resistance value of an external resistor RZQ.

The code generator 500 may be electrically coupled with a resistor outside the semiconductor apparatus. More specifically, the code generator 500 may be electrically coupled to the external resistor RZQ through an external resistor coupling terminal 700.

Figure 2:
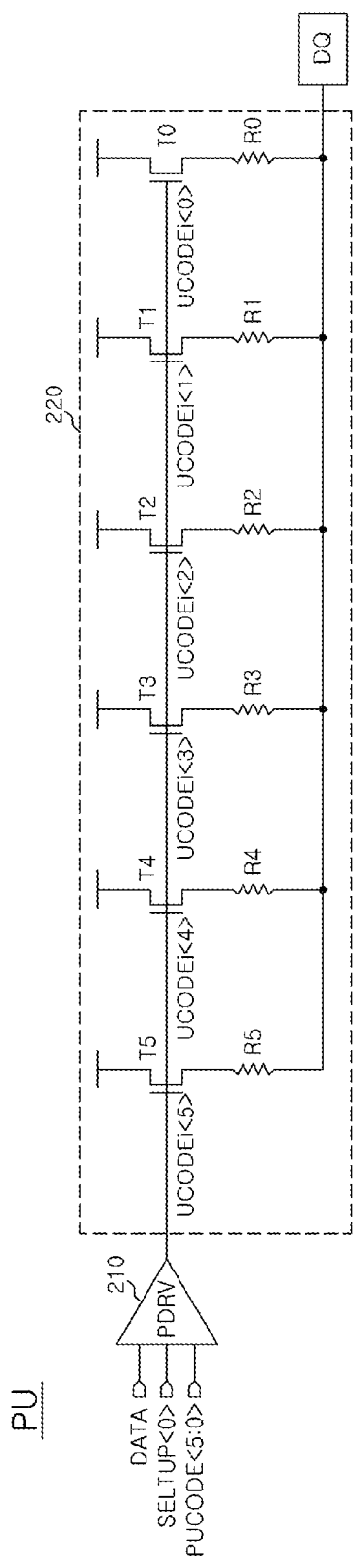
FIG. 2 is a circuit diagram of the leg unit shown in FIG. 1.

Referring to FIG. 2, the leg unit PU inputted with the selection signal SELTUP<0> among the plurality of leg units PU may include a pre-driving unit (PDRV) 210 and a main driving unit 220.

The pre-driving unit 210 may be configured to provide the first code signals PUCODE<5:0> as first internal code signals UCODEi<5:0> to the main driving unit 220 when the data DATA and the selection signal SELTUP<0> are a high level.

The main driving unit 220 may be configured to electrically couple a power supply terminal to resistors that correspond to the first internal code signals UCODEi<5:0> among a plurality of resistors R0 to R5. The plurality of resistors R0 to R5 may be commonly electrically coupled with the data output pad DQ.

The main driving unit 220 may include a plurality of transistors T0 to T5 having the sources electrically coupled with the power supply terminal. The main driving unit 220 may also include the gates which are inputted with the first internal code signals UCODEi<5:0>. Further, the main driving unit 220 may include the plurality of resistors R0 to R5 having one end electrically coupled with the drains of the plurality of transistors T0 to T5 and an other end electrically coupled with the data output pad DQ.

Figure 3:
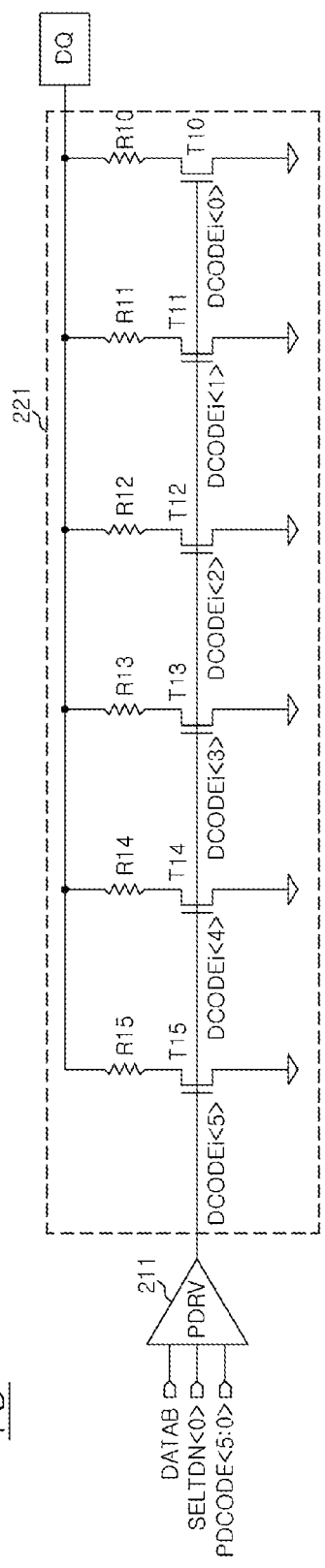
FIG. 3 is a circuit diagram of the leg unit shown in FIG. 1.

Referring to FIG. 3, the leg unit PD inputted with the selection signal SELTDN<0> among the plurality of leg units PD may include a pre-driving unit (PDRV) 211 and a main driving unit 221.

The pre-driving unit 211 may be configured to provide the second code signals PDCODE<5:0> as second internal code signals DCODEi<5:0> to the main driving unit 221 when the data bar DATAB and the selection signal SELTDN<0> are at a high level.

The main driving unit 221 may be configured to electrically couple a ground terminal to resistors that correspond to the second internal code signals DCODEi<5:0> among a plurality of resistors R10 to R15. The plurality of resistors R10 to R15 are commonly electrically coupled with the data output pad DQ.

The main driving unit 221 may include the plurality of resistors R10 to R15 having one end commonly electrically coupled with the data output pad DQ. The main driving unit 221 may also include a plurality of transistors T10 to T15 having the drains electrically coupled with the other ends of the plurality of resistors R10 to R15. Further, the sources may be electrically coupled with the ground terminal and the gates may be inputted with the second internal code signals DCODEi<5:0>.

Figure 4:
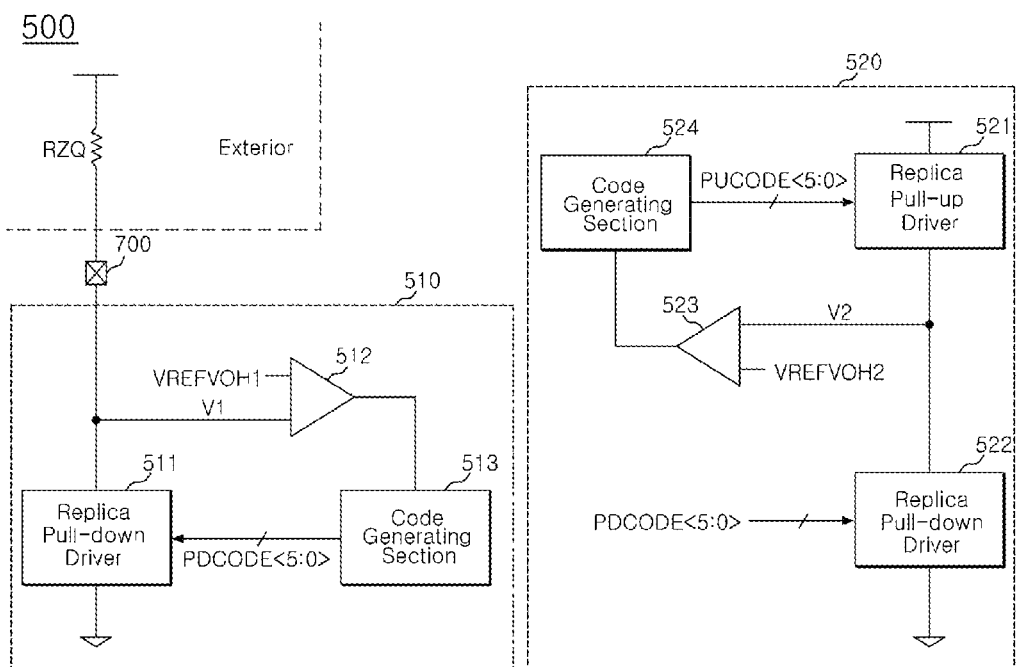
FIG. 4 is a block diagram showing the internal configuration of the code generator shown in FIG. 1.

Referring to FIG. 4, the code generator 500 includes a first code generation unit 510, and a second code generation unit 520.

The first code generation unit 510 may be configured to compare a first replica voltage V1 generated by replicating the output voltage of the pull-down driver 102 and a first reference voltage VREFVOH1. Accordingly, first code generation unit 510 may generate the second code signals PDCODE<5:0>.

The first code generation unit 510 may include a replica pull-down driver 511, a comparing section 512, and a code generating section 513.

The replica pull-down driver 511 is a circuit configured by replicating the main driving unit 221 of the pull-down driver 102.

The replica pull-down driver 511 may be electrically coupled between the external resistor coupling terminal 700 and the ground terminal.

The external resistor RZQ of an external system may be electrically coupled to the external resistor coupling terminal 700.

The replica pull-down driver 511 may be changed in the resistance value according to the second code signals PDCODE<5:0>. In addition, the replica pull-down driver 511 may control the level of the first replica voltage V1 according to a changed resistance value.

The comparing section 512 compares the first replica voltage V1 and the first reference voltage VREFVOH1 and accordingly outputs a comparison result.

The first reference voltage VREFVOH1 may be a value proportional to the voltage level of the power supply terminal. For example, such a value may be VDDQ/2.5, VDDQ/3, etc.

The code generating section 513 controls the values of the second code signals PDCODE<5:0> according to the output of the comparing section 512.

A first resistance value control operation, or, the linked operation of the replica pull-down driver 511, the comparing section 512 and the code generating section 513 ends when the first replica voltage V1 and the first reference voltage VREFVOH1 have substantially the same value.

The second code generation unit 520 may be configured to compare a second replica voltage V2 generated by replicating the voltage of an intermediate node between the pull-down driver 102 and the pull-up driver 101 and a second reference voltage VREFVOH2. Accordingly, the second code generation unit 520 may generate the first code signals PUCODE<5:0>.

The second code generation unit 520 may include a replica pull-up driver 521, a replica pull-down driver 522, a comparing section 523, and a code generating section 524.

The replica pull-up driver 521 is a circuit configured by replicating the main driving unit 220 of the pull-up driver 101.

The replica pull-down driver 522 is a circuit configured by replicating the main driving unit 221 of the pull-down driver 102.

The replica pull-up driver 521 and the replica pull-down driver 522 may be electrically coupled between the power supply terminal and the ground terminal.

The replica pull-down driver 522 is in the state in which the resistance value control is completed by the first resistance value control operation. As a result, the values of the second code signals PDCODE<5:0> are fixed.

The replica pull-up driver 521 may be changed in the resistance value according to the first code signals PUCODE<5:0>. In addition, the replica pull-up driver 521 may control the level of the second replica voltage V2 by a linked operation with the replica pull-down driver 522.

The comparing section 523 compares the second replica voltage V2 and the second reference voltage VREFVOH2 and accordingly outputs a comparison result.

The second reference voltage VREFVOH2 may be a value proportional to the voltage level of the power supply terminal. For example, the value may be VDDQ/2.5, VDDQ/3, etc.

The code generating section 524 controls the values of the first code signals PUCODE<5:0> according to the output of the comparing section 523.

A second resistance value control operation, or, the linked operation of the replica pull-up driver 521, the replica pull-down driver 522, the comparing section 523 and the code generating section 524 ends when the second replica voltage V2 and the second reference voltage VREFVOH2 have substantially the same value.

Referring to FIG. 5, the plurality of resistors R0 to R5 of the main driving unit 220 of the leg unit PU have different resistance values by PVT (power, voltage and temperature) conditions according to a first condition TT, a second condition FF and a third condition SS.

When compared to the first condition TT, the resistance values of the plurality of resistors R0 to R5 are decreased in the case of the second condition FF. In addition, the resistance values of the plurality of resistors R0 to R5 are increased in the case of the third condition SS.

Therefore, by reflecting the above-described characteristic that the resistance values of the plurality of resistors R0 to R5 are changed by PVT conditions, the code generator 500 generates the first code signals PUCODE<5:0> with different values by PVT conditions so that the resistance value of the leg unit PU may be set to a desired value.

For example, when it is required that the pull-up driver 101 has the resistance value of 480 ohm (Ω), the requirement may be met using one leg unit PU.

In this instance, the first code signals PUCODE<5:0> are generated to '100000' (where '1' is a logic high level and '0' is a logic low level). In addition, the corresponding parallel resistance value of the plurality of resistors R0 to R5 becomes 480 ohm.

The parallel resistance values of FIG. 5 are acquired by assuming that the turn-on resistance of the transistors T0 to T5 is 0 ohm. In an actual operation, the parallel resistance values may be values acquired by summing in parallel the turn-on resistance of the transistors T0 to T5 and the serial resistance values of the plurality of resistors R0 to R5.

In the second condition FF, the first code signals PUCODE<5:0> are generated to '001111.' Further, the corresponding parallel resistance value of the plurality of resistors R0 to R5 becomes 480 ohm.

In the third condition SS, the first code signals PUCODE<5:0> are generated to '111111.' In addition, the corresponding parallel resistance value of the plurality of resistors R0 to R5 becomes 479 ohm substantially close to 480 ohm.

In an example, when it is required that the pull-up driver 101 has the resistance value of 360 ohm, the requirement may be met using two leg units PU.

In this case, because two sets of pluralities of resistors R0 to R5 are basically electrically coupled in parallel for the respective two leg units PU, the resistance value of, for example, the two same-ordered resistors R5 corresponds to one half of the resistance value when using one leg unit PU.

For instance, it may be seen that the resistance value of the resistor R5 when using one leg unit PU in the first condition TT is 480 ohm. In contrast, the resistance value of the resistors R5 when using two leg units PU in the first condition TT is 240 ohm.

Therefore, in the first condition TT, the first code signals PUCODE<5:0> are generated to '010101.' In addition, the corresponding parallel resistance value of the two sets of the pluralities of resistors R0 to R5 becomes 366 ohm substantially close to 360 ohm.

In the second condition FF, the first code signals PUCODE<5:0> are generated to '001010.' Further, the corresponding parallel resistance value of the two sets of the pluralities of resistors R0 to R5 becomes 360 ohm.

In the third condition SS, the first code signals PUCODE<5:0> are generated to '101010.' In addition, the corresponding parallel resistance value of the two sets of the pluralities of resistors R0 to R5 becomes 360 ohm.

Figures 6, 7:
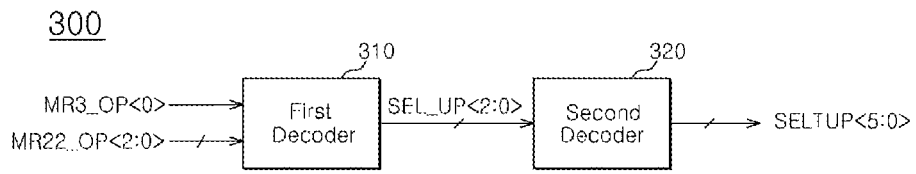
FIG. 6 is a block diagram showing the internal configuration of the first control block shown in FIG. 1.
FIG. 7 is a table showing the outputs of the first control block shown in FIG. 6.

Referring to FIG. 6, the first control block 300 may include a first decoder 310 and a second decoder 320.

The first decoder 310 may be configured to decode the first mode register signal MR3_OP<0> and the second mode register signals MR22_OP<2:0>. In addition, the first decoder 310 may generate pre-selection signals SEL_UP<2:0>.

The second decoder 320 may be configured to decode the pre-selection signals SEL_UP<2:0> and generate the selection signals SELTUP<5:0>.

As described above, the code generator 500 may generate the first code signals PUCODE<5:0> with different values by PVT conditions and thereby. Further, the code generator 500 may set the resistance value of the leg unit PU to a desired value.

Referring to FIG. 7, the first mode register signal MR3_OP<0> and the second mode register signals MR22_OP<2:0> may define the number of leg units PU to be activated, according to a multi-output voltage VOH (VDDQ/3 and VDDQ/2.5) and a PVT condition.

The semiconductor apparatus according to an embodiment may support various output voltages VOH, for example, a first output voltage VDDQ/3 and a second output voltage VDDQ/2.5.

The first mode register signal MR3_OP<0> may be set to a high level in order to support the first output voltage VDDQ/3. In addition, the first mode register signal MRE_OP<0> may be set to a low level in order to support the second output voltage VDDQ/2.5.

In addition, the values of the second mode register signals MR22_OP<2:0> may be set differently to conform to termination resistance values (TERM) according to the respective first output voltage VDDQ/3 and second output voltage VDDQ/2.5 of the external system which communicates with the semiconductor apparatus.

When the second mode register signals MR22_OP<2:0> are set to '000,' the pull-up driver 101 may be deactivated.

When the first mode register signal MR3_OP<0> is set to '1' and the second mode register signals MR22_OP<2:0> are set to '001,' the selection signals SELTUP<5:0> may be outputted to '000001.'

As only one leg unit PU in the pull-up driver 101 is activated according to the selection signals SELTUP<5:0>, the resistance value of the pull-up driver 101 may be set to a default value in the level of the first output voltage VDDQ/3. The default value may be for example, 480 ohm.

When the first mode register signal MR3_OP<0> is set to '1' and the second mode register signals MR22_OP<2:0> are set to '010,' the selection signals SELTUP<5:0> are outputted to '000011.'

As two leg units PU in the pull-up driver 101 are activated according to the selection signals SELTUP<5:0>, the resistance value of the pull-up driver 101 may be set to another value required in the level of the first output voltage VDDQ/3. The other value may be for example, 240 ohm.

In an example, when the first mode register signal MR3_OP<0> is set to '0' and the second mode register signals MR22_OP<2:0> are set to '001,' the selection signals SELTUP<5:0> are outputted to '000011.'

As two leg units PU in the pull-up driver 101 are activated according to the selection signals SELTUP<5:0>, the resistance value of the pull-up driver 101 may be set to a default value in the level of the second output voltage VDDQ/2.5. The default value may be for example, 360 ohm.

When the first mode register signal MR3_OP<0> is set to '0' and the second mode register signals MR22_OP<2:0> are set to '010,' the selection signals SELTUP<5:0> are outputted to '001111.'

As four leg units PU in the pull-up driver 101 are activated according to the selection signals SELTUP<5:0>, the resistance value of the pull-up driver 101 may be set to another value required in the level of the second output voltage VDDQ/2.5. The other value may be for example, 180 ohm.

In comparison to the case where the resistance value of the pull-up driver 101 is set to the default value (480 ohm) in the level of the first output voltage VDDQ/3, if the resistance value of the pull-up driver 101 is set to the default value (360 ohm) in the level of the second output voltage VDDQ/2.5, the number of leg units PU to be activated increases to a double.

DNU (do not use) represents the value of the second mode register signals MR22_OP<2:0> not currently used. In addition, RFU (reserved for future use) represents the value of the second mode register signals MR22_OP<2:0> allocated in advance for future use.

As a consequence, in an embodiment, the multi-output voltage (VDDQ/3 and VDDQ/2.5) is supported using a predetermined number of leg units PU, for example, six leg units PU, and at least eight kinds of resistance value setting (to 60 ohm, 96 ohm, 120 ohm, 160 ohm, 180 ohm, 240 ohm, 360 ohm and 480 ohm).

The support of the multi-output voltage (VDDQ/3 and VDDQ/2.5) and the at least eight kinds of resistance value setting may use the first mode register signal MR3_OP<0> and the second mode register signals MR22_OP<2:0>.

Figures 8, 9:
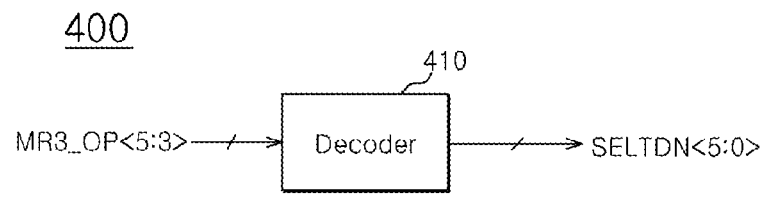
FIG. 8 is a block diagram showing the internal configuration of the second control block shown in FIG. 1.
FIG. 9 is a table showing the outputs of the second control block shown in FIG. 8.

Referring to FIG. 8, the second control block 400 may include a decoder 410.

The decoder 410 may be configured to decode the third mode register signals MR3_OP<5:3> and generate the selection signals SELTDN<5:0>.

Referring to FIG. 9, the third mode register signals MR3_OP<5:3> may define the number of leg units PD to be activated to set the resistance value of the pull-down driver 102.

When the third mode register signals MR3_OP<5:3> are set to '000,' the pull-down driver 102 may be deactivated.

When the third mode register signals MR3_OP<5:3> are set to '001,' the selection signals SELTDN<5:0> are outputted to '000001.'

As only one leg unit PD in the pull-down driver 102 is activated according to the selection signals SELTDN<5:0>, the resistance value of the pull-down driver 102 may be set to, for example, 240 ohm.

When the third mode register signals MR3_OP<5:3> are set to '010,' the selection signals SELTDN<5:0> are outputted to '000011.'

As two leg units PD in the pull-down driver 102 are activated according to the selection signals SELTDN<5:0>, the resistance value of the pull-down driver 102 may be set to another value. The other value may be for example, 120 ohm.

Figure 10:
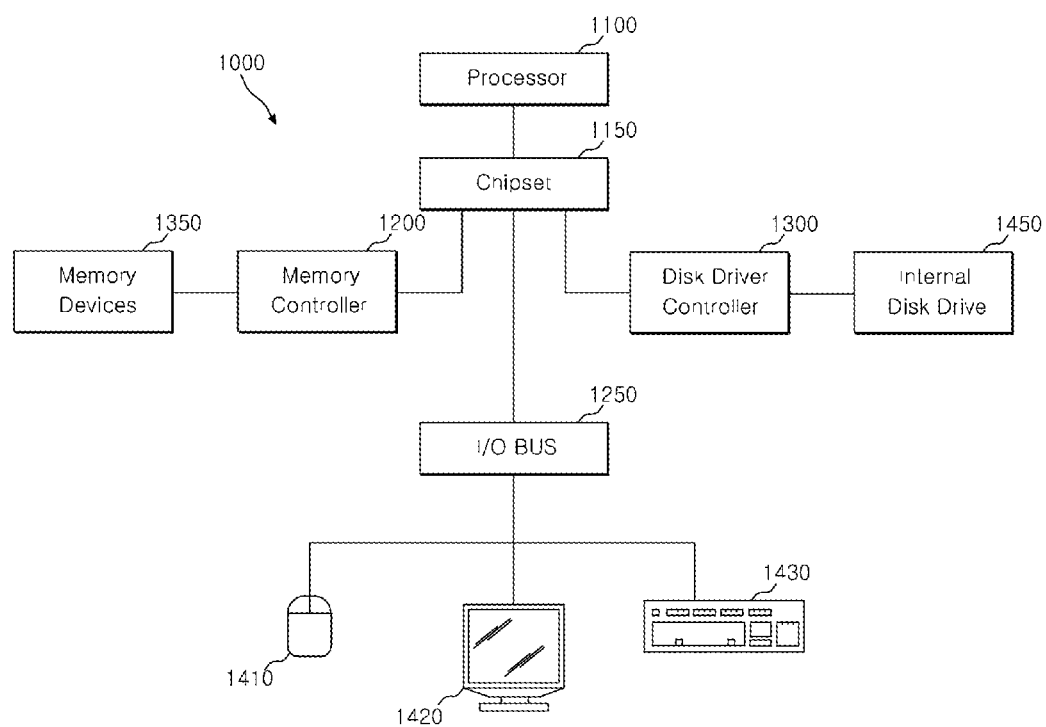
FIG. 10 illustrates a block diagram of a system employing a memory controller circuit in accordance with an embodiment of the invention.

Referring to FIG. 10, a system 1000 may include one or more processors 1100. The processor 1100 may be used individually or in combination with other processors. A chipset 1150 may be electrically coupled to the processor 1100. The chipset 1150 may be a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may also be electrically coupled to one or more memory devices 1350. The memory devices 1350 may include the data output circuit 100 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1410, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of example only. Accordingly, the data output circuit of a semiconductor apparatus described should not be limited based on the described embodiments. Rather, the data output circuit of a semiconductor apparatus described should only be limited in light of the claims that follow when taken in conjunction with the above description and accompanying figures.

What is claimed is:

1. A data output circuit of a semiconductor apparatus, comprising:
a pull-up driver including a plurality of leg units configured to provide respective resistance values which are selected based on code signals, provide a total resistance value which is selected in response to one or more of the plurality of leg units being selectively activated based on selection signals, and configured to apply an output voltage with an output voltage level selected according to the selection of the total resistance value among a plurality of output voltage levels, to a data output pad;

a control block configured to generate the selection signals in response to mode register signals; and a code generator configured to generate the code signals based on a comparison of a reference voltage to a replica output voltage which varies according to an external resistance.

2. The data output circuit according to claim 1, wherein the pull-up driver is configured to apply the output voltage to the data output pad according to data of a high level.

3. The data output circuit according to claim 1, wherein each of the plurality of leg units comprises:
   a pre-driving unit configured to output the code signals when the data and a corresponding selection signal are a high level; and
   a main driving unit configured to electrically couple a power supply terminal to resistors corresponding to the code signals among a plurality of resistors commonly electrically coupled with the data output pad.

4. The data output circuit according to claim 1, wherein the control block comprises:
   a first decoder configured to decode a first mode register signal and second mode register signals, and generate pre-selection signals; and
   a second decoder configured to decode the pre-selection signals, and generate the selection signals.

5. The data output circuit according to claim 4, wherein the first mode register signal comprises a signal to select a voltage level among the plurality of output voltage levels.

6. The data output circuit according to claim 4, wherein the second mode register signals comprise signals to select one or more leg units among the plurality of leg units.

7. The data output circuit according to claim 1,
   wherein each of the plurality of leg units comprises a plurality of resistors commonly electrically coupled with the data output pad, and
   wherein the plurality of resistors have different resistance values by PVT (power, voltage and temperature) conditions.

8. The data output circuit according to claim 1, wherein the code generator is configured to generate the code signals to different values by the PVT conditions.

9. The data output circuit according to claim 1, further comprising:
   a pull-down driver configured to be electrically coupled with the data output pad.

10. The data output circuit according to claim 9, wherein the code generator is configured to compare a replica voltage and the reference voltage, and generate the code signals.

11. The data output circuit according to claim 9, wherein the code generator comprises:
    a replica pull-down driver configured by replicating the pull-down driver;
    a replica pull-up driver configured by replicating the pull-up driver, and configured to be changed in a resistance value according to the code signals and control a level of the replica voltage by a linked operation with the replica pull-down driver;
    a comparing section configured to compare the replica voltage and the reference voltage, and output a comparison result; and
    a code generating section configured to control values of the code signals in response to an output of the comparing section.

12. The data output circuit according to claim 1, wherein the number of leg units to be activated when a first output voltage level is selected and the number of leg units to be activated when a second output voltage level is selected are different.

13. The data output circuit according to claim 1, wherein, under a condition that a resistance value of the pull-up driver at the first output voltage level and a resistance value of the pull-up driver at the second output voltage level are the same, the number of leg units to be activated at the first output voltage level and the number of leg units to be activated at the second output voltage level are different.

14. The data output circuit according to claim 1, wherein, when compared to the number of leg units to be activated among the plurality of leg units according to a default resistance value of the pull-up driver at the first output voltage level, the number of leg units to be activated among the plurality of leg units according to the default resistance value of the pull-up driver at the second output voltage level increases to a multiple.

15. The data output circuit according to claim 14, wherein the code generator is configured to generate the code signals to different values with respect to the first output voltage level and the second output voltage level.

16. A data output circuit of a semiconductor apparatus, comprising:
    a first plurality of leg units commonly electrically coupled to a data output pad and configured to pull up the data output pad, apply a first output voltage to the data output pad, and control a level of the first output voltage in response to first selection signals and first code signals;
    a second plurality of leg units commonly electrically coupled to the data output pad and configured to pull down the data output pad, apply a second output voltage to the data output pad, and control a level of a second output voltage in response second selection signals and second code signals; and
    a code generator configured to generate the second code signals to control resistance values the second plurality of leg units based on an output of a comparator which compares a reference voltage to a replica output voltage.

17. The data output circuit of claim 16, further comprising:
    a code generator configured to generate the first code signals and the second code signals to control resistance values of the first plurality of leg units and the second plurality of leg units.

18. The data output circuit of claim 17, wherein the code generator is configured to generate the second code signals by comparing a replica voltage to the reference voltage.

19. A data output circuit of a semiconductor apparatus, comprising:
    a pull-up driver commonly electrically coupled to a data output pad and configured to apply a first output voltage to the data output pad in response to a data and control the level of the first output voltage;
    a pull-down driver commonly electrically coupled to the data output pad and configured to apply a second output voltage to the data output pad in response to the data and control the level of the second output voltage; and
    a code generator configured to control the level of the second output voltage based on an output of a comparator which compares a reference voltage to a replica output voltage.

20. The data output circuit according to claim 19, further comprising:

a plurality of leg units configured to control the level of the first output voltage when the data is at the high level.

* * * * *